United States Patent

Andrieu

(10) Patent No.: US 9,985,029 B2
(45) Date of Patent: May 29, 2018

(54) INTEGRATED CIRCUIT WITH NMOS AND PMOS TRANSISTORS HAVING DIFFERENT THRESHOLD VOLTAGES THROUGH CHANNEL DOPING AND GATE MATERIAL WORK FUNCTION SCHEMES

(71) Applicant: Commissariat a l'energie atomique et aux energies alternatives, Paris (FR)

(72) Inventor: Francois Andrieu, Saint Ismier (FR)

(73) Assignee: Commissariat à l'energie atomique et aux énergies alternatives, Paris (FR)

( * ) Notice: Subject to any disclaimer, the term of this patent is extended or adjusted under 35 U.S.C. 154(b) by 0 days. days.

(21) Appl. No.: 15/652,925

(22) Filed: Jul. 18, 2017

(65) Prior Publication Data

US 2018/0026036 A1   Jan. 25, 2018

(30) Foreign Application Priority Data

Jul. 22, 2016   (FR) .................................. 16 57020

(51) Int. Cl.
*H01L 27/092*   (2006.01)
*H01L 27/12*   (2006.01)
(Continued)

(52) U.S. Cl.
CPC ...... *H01L 27/0922* (2013.01); *H01L 27/0928* (2013.01); *H01L 29/0649* (2013.01); *H01L 29/7848* (2013.01); *H01L 29/4966* (2013.01)

(58) Field of Classification Search
CPC ..... H01L 21/823878; H01L 21/823828; H01L 21/823864; H01L 21/823814; H01L 21/84;

(Continued)

(56) References Cited

U.S. PATENT DOCUMENTS 8,106,455 B2 * 1/2012 Greene ........... H01L 21/823462
257/347
8,415,743 B2 * 4/2013 Cai ..................... H01L 27/1203
257/348

(Continued)

OTHER PUBLICATIONS

French Preliminary Search Report dated Mar. 27, 2017 in French Application 16 57020 filed on Jul. 22, 2016 (with English Translation of Categories of cited documents and Written Opinion).

(Continued)

*Primary Examiner* — Marc Armand
*Assistant Examiner* — Younes Boulghassoul
(74) *Attorney, Agent, or Firm* — Oblon, McClelland, Maier & Neustadt, L.L.P.

(57) ABSTRACT

An integrated circuit comprising: first to third nMOS transistors with different threshold voltages, and first to third pMOS transistors with different threshold voltages, the nMOS transistors having channel regions made of silicon subjected to tensile stress and/or said pMOS transistors having channel regions made of SiGe subjected to compressive stress; a first well and a second well that are arranged underneath the nMOS transistors and underneath the pMOS transistors, respectively, with one and the same doping; two nMOS gate stacks comprising one and the same material, two of the nMOS gate stacks comprising materials having separate work functions, an nMOS gate stack having one and the same material as a pMOS gate stack, with the equation: $G_p*V_{dds}-G_n*G_{nds}=S_n*|\sigma_n|+S_p*(|\sigma_p|-1.65*10^9)-VarC_{ais}+K$.

13 Claims, 3 Drawing Sheets

(51) Int. Cl.
*H01L 29/78* (2006.01)
*H01L 29/06* (2006.01)
*H01L 29/49* (2006.01)

(58) Field of Classification Search
CPC ............. H01L 21/8238; H01L 27/0922; H01L 27/0927; H01L 27/092; H01L 27/1203; H01L 27/12; H01L 27/0924; H01L 27/0925; H01L 27/0928; H01L 29/4966; H01L 29/78603; H01L 29/0649; H01L 29/7848
USPC .................. 257/351, 348, 353, 369; 438/154
See application file for complete search history.

(56) References Cited

U.S. PATENT DOCUMENTS

| | | | |
|---|---|---|---|
| 8,969,967 B2* | 3/2015 | Noel | H01L 27/1108 257/351 |
| 9,190,334 B2* | 11/2015 | Thomas | H01L 21/84 |
| 9,219,078 B2* | 12/2015 | Cheng | H01L 21/823807 |
| 2010/0164011 A1* | 7/2010 | Frank | H01L 27/11 257/369 |
| 2012/0302023 A1* | 11/2012 | Javorka | H01L 29/7781 438/285 |
| 2014/0312423 A1 | 10/2014 | Cheng et al. | |
| 2015/0200205 A1 | 7/2015 | Cheng et al. | |
| 2016/0020154 A1 | 1/2016 | Cheng et al. | |
| 2016/0079127 A1 | 3/2016 | Hook et al. | |
| 2016/0079277 A1 | 3/2016 | Hook et al. | |
| 2016/0372485 A1 | 12/2016 | Hook et al. | |
| 2017/0117296 A1* | 4/2017 | Chhun | H01L 27/1203 |

OTHER PUBLICATIONS

O. Weber, et al. "Work-function Engineering in Gate First Technology for Multi-$V_T$ Dual-Gate FDSOI CMOS on UTBOX", 2010 IEEE International Electron Devices Meeting, 2010, 4 pages.

* cited by examiner

INTEGRATED CIRCUIT WITH NMOS AND PMOS TRANSISTORS HAVING DIFFERENT THRESHOLD VOLTAGES THROUGH CHANNEL DOPING AND GATE MATERIAL WORK FUNCTION SCHEMES

The invention relates to an integrated circuit, and in particular an integrated circuit combining field-effect transistors produced on an insulation layer, with a back gate, and having separate threshold voltages.

Many studies have focused on reducing the static consumption of logic gates while increasing their switching speed. Certain integrated circuits currently being developed incorporate both low-consumption logic gates and fast-access logic gates, i.e. with high switching speed. To generate these two types of logic gates on one and the same integrated circuit, the threshold voltage of certain transistors is lowered to form fast-access logic gates or logic gates with a high on-state current, and the threshold voltage of other transistors is increased to form low-consumption logic gates.

It is thus typically possible to have super-low threshold voltage transistors, termed SLVT, low threshold voltage transistors, termed LVT, high threshold voltage transistors, termed HVT, and intermediate threshold voltage transistors, termed SVT or RVT. Typically, SLVT transistors have a threshold voltage of less than or equal to 300 mV, LVT transistors have a threshold voltage of less than or equal to 450 mV, HVT transistors of greater than or equal to 600 mV and RVT transistors of between 450 mV and 600 mV.

Document US2014077300 describes an integrated circuit architecture including FDSOI transistors with various threshold voltages. The threshold voltage of the various transistors is in particular adjusted by various biases of P-doped wells and of back gates formed underneath an ultra-thin insulation layer. In order to prevent short circuits to the substrate or between the P-doped wells, deeply buried N-doped wells are arranged between the P-doped wells and the substrate. The deeply buried wells are also biased. Various gate materials are also used to modulate the threshold voltage of the transistors. By using trenches of different depths, it is possible to eliminate intrinsic diodes between N-type and P-type wells, by creating isolation through the deeply buried wells.

In this document, N-doped back gates are biased by means of P-doped wells. On account of the isolation provided by the deeply buried wells, it is possible to modify the bias voltages on the wells and back gates in order to more accurately regulate the threshold voltages of the transistors. Such biasing is therefore established by means of a diode formed between a P-doped well and an N-doped back gate. Such a diode increases the time to establish the biasing of the back gates.

The document entitled '14 nm FDSOI Technology for High Speed and Energy Efficient Applications', published on pages 14 and 15 in '2014 Symposium on VLSI Technology Digest of Technical Papers', describes the use of SiGe in the channel of pMOS transistors to modulate their threshold voltage, the use of gate materials with various work functions, the use of various types of doping for wells/back gates, and also the use of various biases on these wells to modulate the threshold voltages of the transistors.

The production of integrated circuits, with nMOS and pMOS transistors each having a large variety of different threshold voltages, then requires a complex manufacturing method to form and bias wells of various types. Moreover, it is desirable to minimize leakages, caused by channels made of SiGe, which however reduces the options for modulating the threshold voltage of the pMOS transistors.

The invention aims to overcome one or more of these drawbacks. The invention thus pertains to an integrated circuit such as defined in the appended claims.

Other features and advantages of the invention will emerge clearly from the description thereof given hereinafter, by way of wholly nonlimiting indication, with reference to the appended drawings, in which.

The invention proposes an integrated circuit including nMOS transistors with at least three different threshold voltage levels, and including pMOS transistors with at least three different threshold voltage levels, of the UTBOX FDSOI type. The invention aims to minimize the gate materials used by simplifying the design of the integrated circuit and in particular the structure intended to bias the back gates/wells of the transistors. More particularly, the invention proves to be advantageous when the nMOS transistors have at least four different threshold voltage levels, and when the pMOS transistors have at least four different threshold voltage levels.

Figure 1:
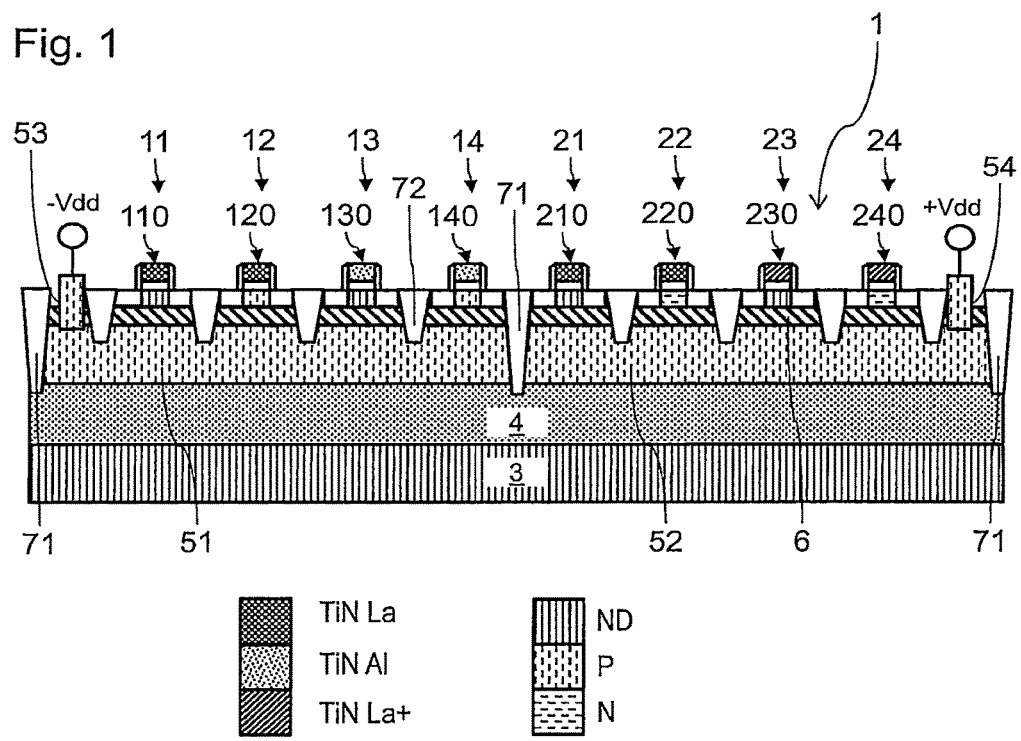
FIG. 1 is a cross-sectional view of an integrated circuit according to an example of a first embodiment of the invention.

FIG. 1 is a cross-sectional view of an integrated circuit 1 according to an example of a first embodiment of the invention. The integrated circuit 1 includes nMOS transistors 11 to 14 having different threshold voltages, respectively SLVT, LVT, RVT and HVT. The integrated circuit 1 includes pMOS transistors 21 to 24 having different threshold voltages, respectively SLVT, LVT, RVT and HVT. For the sake of simplicity, the various types of nMOS transistors 11 to 14 are illustrated side by side, as are the various types of pMOS transistors 21 to 24. A silicon-based semiconductor layer, typically referred to using the term active layer, is used to form, for example, the source, drain and channel regions of the transistors 11 to 14 and 21 to 24. The transistors 11 to 14 and 21 to 24 have respective gate stacks 110, 120, 130, 140, 210, 220, 230 and 240, arranged on the active layer.

Figure 2:
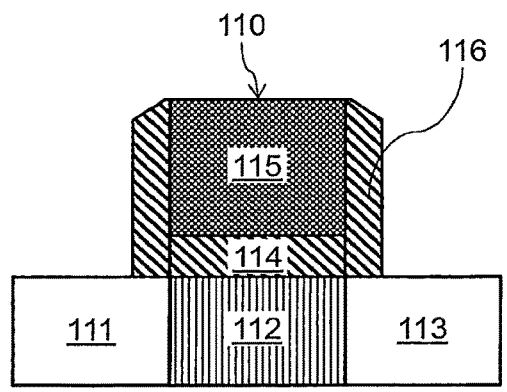
FIG. 2 is an example of a gate stack of a transistor of the integrated circuit of FIG. 1.

An example of a structure for the transistor 11 is illustrated with reference to FIG. 2. A source region 111, a channel region 112 and a drain region 113 are arranged in the active layer. The gate stack 110 is arranged plumb with the channel region 112. The gate stack 110 includes a gate insulator 114 formed on the channel region 112. A gate material, in this case a gate metal 115, is formed on the gate insulator 114. Spacers made of dielectric material 116 are arranged on either side of the overlap of the gate insulator 114 and of the gate material 115.

The integrated circuit 1 is of the SOI type, and thus comprises an insulating layer 6 on which the nMOS transistors 11 to 14 and the pMOS transistors 21 to 24 are arranged. The layer 6 is of the UTBOX (Ultra-Thin Buried Oxide) type, and thus has a thickness at most equal to 50 nm, preferably at most equal to 25 nm, and for example of between 5 and 25 nm. As detailed hereinafter, the UTBOX layer 6 makes it possible to influence the threshold voltage of the transistors 11 to 14 and 21 to 24 by means of back gates. The layer 6 is surmounted by the active layer. The layer 6 is for example formed, in a manner known per se, of silicon oxide.

The integrated circuit 1 includes a well 51 arranged underneath the nMOS transistors 11 to 14, underneath the insulation layer 6 (and in this case in contact with this insulation layer 6). The integrated circuit 1 includes a well 52 arranged underneath the pMOS transistors 21 to 24, underneath the insulation layer 6 (and in this case in contact with the insulation layer 6). The wells 51 and 52 in this case have one and the same P-type doping, and have one and the same concentration of P-type dopants. The production of the wells 51 and 52 may thus be carried out simultaneously with a relatively simple manufacturing process. A terminal 53 makes it possible to bias the well 51 to a potential Gnds. A terminal 54 makes it possible to bias the well 52 to a potential Vdds, different from Gnds. A bias circuit, not illustrated, makes it possible to apply the potentials Gnds and Vdds to the terminals 53 and 54, respectively. With the well 51 extending as far as into contact with the insulation layer 6, the upper part of the well 51 forms a biased back gate for each of the transistors 11 to 14. With the well 52 extending as far as into contact with the insulation layer 6, the upper part of the well 52 forms a biased back gate for each of the transistors 21 to 24.

The transistors 11 to 14 are isolated from one another by isolation trenches 72 passing through their active layer. The isolation trenches 72 do not extend through the well 51, so that the entire well 51 is able to be biased by means of the terminal 53. The transistors 21 to 24 are also isolated from one another by isolation trenches 72 passing through their active layer. The isolation trenches 72 do not extend through the well 52, so that the entire well 52 is able to be biased by means of the terminal 54. As an alternative, MESA isolation trenches 72 may also be produced.

The wells 51 and 52 are formed on a dielectric layer 4. The dielectric layer 4 may also, in a manner known per se, be replaced with a deeply buried well, the doping of which is opposite to that of the wells 51 and 52. The dielectric layer 4 (for example made of silicon oxide) is formed on a substrate of semiconductor material 3 (for example, in a manner known per se, made of not intentionally doped silicon). Deep isolation trenches 71 extend through the active layers and, where appropriate, through the wells 51 and 52, as far as the dielectric layer 4. The isolation trenches 71 make it possible to isolate the nMOS transistors 11 to 14 from the other transistors, and make it possible to isolate the pMOS transistors 21 to 24 from the other transistors. The isolation trenches 71 make it possible in particular, where appropriate, to isolate the well 51 and the well 52 with respect to a potential other than that of their respective terminal. The isolation trenches 71 make it possible in particular to bias the wells 51 and 52 independently with respect to one another.

Among the nMOS transistors 11 to 14:
at least two of the gate stacks have one and the same gate material composition;
at least two of the gate stacks have different gate material compositions, with different work functions.

Among the pMOS transistors 21 to 24:
at least two of the gate stacks have one and the same gate material composition;
at least two of the gate stacks have different gate material compositions, with different work functions. Moreover, at least one gate material of a gate stack of one of the nMOS transistors has the same composition as a gate material of a gate stack of one of the pMOS transistors.

The use of various gate material compositions with various work functions for nMOS transistors and of various gate material compositions with various work functions for pMOS transistors makes it possible to use this parameter to modulate the threshold voltage levels of the nMOS transistors on the one hand and of the pMOS transistors on the other hand. The use of identical gate material compositions for various nMOS transistors, for various pMOS transistors and for at least one of the nMOS transistors and one of the pMOS transistors furthermore makes it possible to limit the number of different gate materials, and thus to limit the complexity of the method for manufacturing the integrated circuit 1.

In order to make it possible to have a sufficient number of different threshold voltages among the nMOS transistors, while limiting the complexity of the manufacturing method, the channel regions of the nMOS transistors 11, 12, 13 and 14 have two different channel doping configurations, and only two different configurations. One channel region is for example of the not intentionally doped type, the other channel region being, for example, of the P-doped type. This difference in doping type is configured to bring about a threshold voltage difference DVT between two otherwise identical nMOS transistors. This threshold voltage difference DVT is for example adjusted in terms of amplitude through the concentration of dopant in the channel region. The threshold voltage difference DVT corresponds to the threshold voltage difference that it is desired to achieve between the various successive threshold voltage levels of the nMOS transistors.

In order to make it possible to have a sufficient number of different threshold voltages among the pMOS transistors, while limiting the complexity of the manufacturing method, the channel regions of the pMOS transistors 21, 22, 23 and 24 have two different channel doping configurations, and only two different configurations. One channel region is for example of the not intentionally doped type, the other channel region being, for example, of the N-doped type. This difference in doping type is configured to bring about the same threshold voltage difference DVT between two otherwise identical pMOS transistors. The threshold voltage difference DVT is for example adjusted in terms of amplitude through the concentration of dopant in the channel region. The threshold voltage difference DVT corresponds to the threshold voltage difference that it is desired to achieve between the various successive threshold voltage levels of the pMOS transistors.

The doping of the channel of the nMOS and pMOS transistors may be performed, in a manner known per se, through dopant implantation steps.

Use will be made of nMOS transistors 11 to 14 having a channel region having a tensile stress in the direction of conduction (that is to say the direction between source and drain). Such a tensile stress makes it possible to improve the mobility of the electrons and to reduce the threshold voltage of the nMOS transistors 11 to 14. Use will be made of pMOS transistors 21 to 24 having a channel region having a compressive stress in the direction of conduction. Such a compressive stress also makes it possible to improve the mobility of the holes and to reduce the threshold voltage level of the pMOS transistors 21 to 24.

Moreover, in order to make it possible to balance the respective threshold voltages of an nMOS transistor and of a pMOS transistor of one and the same level, with the parameters mentioned previously, the various transistors will satisfy the following equation:

$$Gp*Vdds-Gn*Gnds=Sn*|\sigma n|+Sp*(|\sigma p|-1.65*10^9)-VarCais+K$$

Gn being the sensitivity of the threshold voltage of the nMOS transistors to the doping of the well 51, Sn the sensitivity of the threshold voltage of the nMOS transistors to the tensile stress in their channel region, σn the amplitude of the tensile stress in the channel region of the nMOS transistors, Gp the sensitivity of the threshold voltage of the pMOS transistors to the doping of the well 52, Sp the sensitivity of the threshold voltage of the pMOS transistors to the compressive stress in their channel region, σp the amplitude (in pascals) of the compressive stress in the channel region of the pMOS transistors, VarCais a threshold voltage shift dependent on the doping of the wells 51 and 52, K=2*DVT if the various gate stacks of said nMOS and pMOS transistors comprise only two different gate material compositions, or K=0 if the various gate stacks of the nMOS and pMOS transistors comprise at least three different gate material compositions.

In the example of FIG. 1:

3 different gate material compositions are used, therefore K=0;

VarCais=DVT (In this particular case, as VarCais depends on the thickness of the buried insulation layer, on the doping of the well, on the channel thickness and on the thickness of the gate oxide. Varcais is related to Gn/Gp).

In the example of FIG. 1, VarCais has a value defined by the P-type wells 51 and 52. It is also possible to envisage replacing the wells 51 and 52 with N-type wells, which will modify the sign of the value VarCais.

We take in this case a scenario where the value DVT between the successive threshold voltage levels is 80 mV.

For two nMOS transistors of successive threshold voltages (for example the

SLVT transistor 11 and the LVT transistor 12), their respective threshold voltages will be denoted by Vtn1 and Vtn2, with Vtn1<Vtn2.

For two pMOS transistors of successive threshold voltages (for example the SLVT transistor 21 and the LVT transistor 22), their respective threshold voltages will be denoted by Vtp1 and Vtp2, with −Vtp1<−Vtp2 (and |Vtp1|<|Vtp2|, the threshold voltages of the pMOS transistors being negative).

Depending on various parameters, the threshold voltage of the transistors varies in the following manner, depending on the stress and on the work function of the gate:

Vtn≈Wfn−Gn*Gnds−Sn*|σn| for the threshold voltage Vtn of an nMOS transistor, with Wfn being the work function of its gate material. Increasing the tensile stress in the channel region therefore leads to a reduction in Vtn;

−Vtp≈−Wfp+Gp*Vdds−Sp*|σp| for the threshold voltage Vtp of a pMOS transistor, with Wfp being the work function of its gate material. Increasing the compressive stress in the channel region therefore leads to a reduction in −Vtp;

The following values, for example, are common:

Gp=Gn=100 mV/V;

Sn=163 mV/GPa;

Sp=194 mV/GPa;

|σn|=0.85 GPa;

|σp|=2.3 GPa

It may be noted that |σp| n is proportional to the mole fraction of the germanium in the channel of the pMOS transistors subjected to compressive stress. We then have the following equation:

Sp*|σp|=Sxp*xGe, with Sxp the influence of the percentage of germanium in the channel of the pMOS transistor on its threshold voltage, and xGe the percentage of germanium in the channel of this pMOS transistor. With Sxp=12.8 mV/%, a value of xGe of 25% results in a threshold voltage drop of 320 mV, and in a compressive stress in its channel of −1.65 GPa. By convention, a compressive stress will take a negative value, and a tensile stress a positive value.

For two otherwise identical transistors, it is desired that passing from one threshold voltage level to another (shifting of a DVT amplitude) be achieved in a manner dependent on the doping or lack of doping of the channel.

For two otherwise identical transistors, it is desired that the influence of the work function of the gate material on the value DVT correspond to a difference of two output voltage levels (for example from SLVT to RVT). This requirement may be expressed as follows:

2DVT=(DWfn2−DWfn1) for an nMOS

2DVT=(DWfp1−DWfp2) for a pMOS

With DWfn1, DWFn2, DWfp1 and DWfp2 being the respective work function shifts of the first and second nMOS transistors, and of the first and second pMOS transistors with respect to the work function of a gate material made of TiN (which has a value of 4.55 eV to within +/−25 mV depending on the manufacturing process), with DWfn2>DWfn1 and DWfp1>DWfp2.

In the example of FIG. 1, it is desired:

that the first nMOS transistor have the same threshold voltage as an nMOS transistor with an unstressed and undoped channel, with an N-doped and unbiased back gate, and with TiN as gate material;

that the first pMOS transistor have the same threshold voltage as a pMOS transistor with an SiGe channel subjected to 1.65 GPa of compressive stress, with a P-doped and unbiased back gate, and with TiN as gate material. nMOS and pMOS transistors corresponding to the 14 nm/22 nm technological node are taken as reference in this case.

In the example of FIG. 1, three and only three different gate material compositions are used to form the nMOS transistors 11 to 14 and the pMOS transistors 21 to 24. In this case, we will set DWfn1=DWfp1.

The previous equation may then be expressed as $$Gp*Vdds-Gn*Gnds=Sn*|\sigma n|+Sp*(|\sigma p|-1.65*10^9)-VarCais$$

The equation will generally be simplified by Gp=Gn. Moreover, the bias, like the equation, will be simplified by using Vdds=−Gnds.

In the example of FIG. 1, it is advantageously satisfied that Vdds=−Gnds, and that Vdds=+Vdd, the amplitude of the supply voltage of the nMOS transistors 11 to 14 and the pMOS transistors 21 to 24 thus advantageously being used to bias the wells 51 and 52.

The integrated circuit 1 according to the invention makes it possible overall to simplify the structure of the terminals for the purpose of biasing the wells 51 and 52, a single terminal 53 being used to bias the well 51 of the transistors 11 to 14, a single terminal 54 being used to bias the well 52 of the transistors 21 to 24. The integrated circuit 1 according to the invention furthermore makes it possible not to require terminals that are specific to the back gates, such back gates being formed by the wells 51 and 52 that are biased by the terminals 53 and 54, respectively.

Moreover, the invention makes it possible to achieve a large variety of threshold voltages for both the nMOS transistors and the pMOS transistors, from a small number of gate materials, which consequently simplifies the method for manufacturing the integrated circuit.

The following table outlines the configurations of the various transistors of FIG. 1:

| Transistor | Gate | Channel | Channel doping | Well bias |
|---|---|---|---|---|
| 11 SLVT | TiN La | Si subjected to tensile stress | No | −Vdd |
| 12 LVT | TiN La | Si subjected to tensile stress | P-type | −Vdd |
| 13 RVT | TiN Al | Si subjected to tensile stress | No | −Vdd |
| 14 HVT | TiN Al | Si subjected to tensile stress | P-type | −Vdd |
| 21 SLVT | TiN La | $Si_{0.65}Ge_{0.35}$ | No | +Vdd |
| 22 LVT | TiN La | $Si_{0.65}Ge_{0.35}$ | N-type | +Vdd |
| 23 RVT | TiN La+ | $Si_{0.65}Ge_{0.35}$ | No | +Vdd |
| 24 HVT | TiN La+ | $Si_{0.65}Ge_{0.35}$ | N-type | +Vdd |

The concentration of dopant in the doped channels in this case is $10^{18}$ cm-3.

In this example, the work function of the gate materials is modulated:

by including layers of lanthanum of varying thickness in a gate metal made of TiN of the gate stack, to lower its work function;

by including aluminium in a gate metal made of TiN of the gate stack, to increase its work function.

A starting gate metal made of TiN proves to be advantageous on account of its compatibility with gate first manufacturing methods, involving annealing steps with high thermal budgets.

In a manner known per se, the use of lanthanum to increase the work function of a gate metal made of TiN may be implemented as follows: a layer containing lanthanum, of a predefined thickness, is deposited on the gate insulator, TiN is deposited on the layer of lanthanum, and then an annealing step is carried out for the purpose of achieving the diffusion of the lanthanum in the TiN.

In the example of the table:

the TiNAl has a work function increased by 100 mV with respect to the work function of a gate material made of TiN;

the TiNLa denotes a gate material with a thin layer of La. The TiNLa has a work function reduced by 60 mV with respect to the work function of a gate material made of TiN;

the TiNLa+ denotes a gate material with a moderately thick layer of La. The TiNLa has a work function reduced by 220 mV with respect to the work function of a gate material made of TiN.

The document entitled 'In depth analysis of dopant effect on high-k metal gate effective work function' by Mrs Leroux et al, on pages 13 to 16 of an IEEE publication of 2012, describes examples of methods making it possible to modulate the work function of a gate material.

The SiGe channels of the pMOS transistors are subjected to compressive stress in this case (in the direction of conduction). The threshold voltage of the pMOS transistors is then reduced by substantially 14 mV per percent of germanium in the channel, starting from 25%. For the case shown above, with a germanium percentage of 35%, the threshold voltage is reduced by 140 mV. With the parameters mentioned previously, it is estimated that a silicon channel subjected to tensile stress (in the direction of conduction) brings about a reduction of 140 mV in the threshold voltage of the nMOS transistors.

In the example of FIG. 1, a bias of −Vdd on the well 51 brings about a reduction in the threshold voltage of the nMOS transistors of 80 mV, and a bias of +Vdd on the well 52 brings about an increase in the threshold voltage of the pMOS transistors of 80 mV (assuming Vdd=0.8 V and Gn=Gp=100 mV/V).

This example advantageously uses the supply voltage +Vdd or −Vdd on the wells 51 or 52, the wells 51 or 52 thus being biased with a voltage of one and the same amplitude as the supply voltage of the various transistors, as suggested previously.

For the transistor 11 of the table, starting from the threshold voltage Vrefn corresponding to the reference nMOS transistor, its voltage Vtn is defined as follows:

Vtn11=Vrefn −60 mV [gate material made of TiN La]+80 mV [P-doped well]−140 mV [tensile stress of the channel region]+120 mV [bias of the well to −Vdd]=Vrefn For the transistor 12, Vtn12=Vtn11+80 mV [P-doping of the channel]=Vrefn+80 mV For the transistor 13, Vtn13=Vtn11+160 mV [work function for a gate material made of Tin Al]=Vrefn+160 mV For the transistor 14, Vtn14=Vtn12+160 mV [work function for a gate material made of Tin Al]=Vrefn+240 mV For the transistor 21 of the table, starting from the threshold voltage Vrefp corresponding to the reference pMOS transistor, its voltage Vtp is defined as follows:

|Vtp21|=Vrefp+60 mV [gate material made of TiN La]−140 mV [compressive stress of the channel region with 35% Ge]+80 mV [bias of the well to +Vdd]=|Vrefp|

For the transistor 22, |Vtp22|=|Vtp21|+80 mV [N-doping of the channel]=|Vrefp|+80 mV For the transistor 23, |Vtp23|=|Vtp21|+160 mV [work function for a gate material made of Tin La+]=|Vrefp|+160 mV For the transistor 24, |Vtp24|=|Vtp22|+160 mV [work function for a gate material made of Tin La+]=|Vrefp|+240 mV In practice, it may be desirable to keep DWfn2≤100 mV for issues regarding the availability of gate materials. If we set DWfn2=100 mV (TiNAl in the previous example), we deduce from the previous equations DWfn1=−60 mV and DWfp1=−220 mV, and Gnds=−1.2 V et Vdds=0.7 V. (if the layer 4 is made of semiconductor material, to reverse-bias the diodes formed by the well 51/layer 4 and the well 52/layer 4, with P-type wells 51 and 52, the layer 4 is N-type. The bias applied to the layer 4 is then greater than the maximum bias applied to the wells 51 and 52. The substrate 3 is advantageously P-type, biased to the ground Gnd. In the example above, the voltage V4 on the layer 4 satisfies V4>0.7 V, for example V4=1.2 V or 1.8 V).

Figure 3:
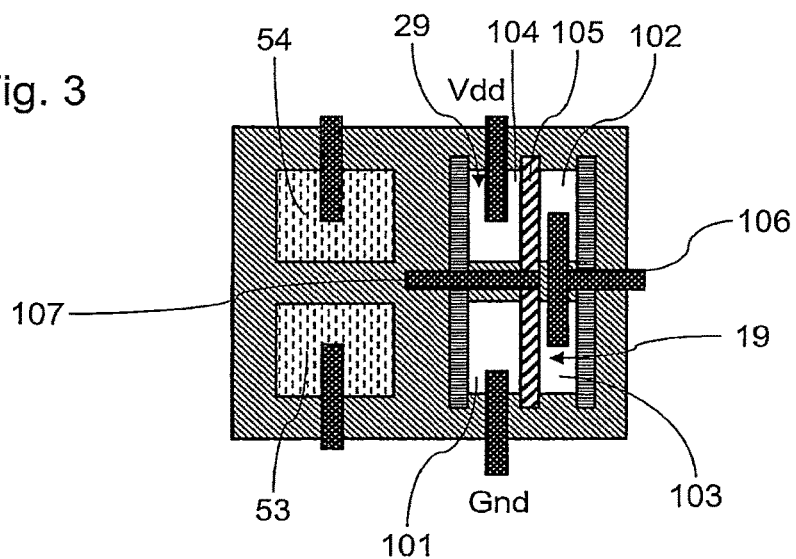
FIG. 3 is a plan view of an example of a configuration of a pair of transistors of an integrated circuit according to the invention.

FIG. 3 is a plan view of an example of a configuration of a pair of transistors of an integrated circuit according to the invention. The pair of transistors in this case forms a balanced cell of transistors with identical threshold voltage levels. In the illustration, one nMOS transistor 19 from a row of nMOS transistors is connected in series with one pMOS transistor 29 from a row of pMOS transistors. The source 101 of the transistor 19 is connected to a ground potential Gnd, and its drain 103 is connected to the source 102 of the transistor 2 by means of a connector 106. The drain 104 of the transistor 29 is connected to a supply potential Vdd. The gates 105 of the transistors 19 and 29 are connected together and biased by means of a connector 107. A terminal 53 makes it possible to bias the well underneath the transistor 19 to a potential Gnds. A terminal 54 makes it possible to bias the well underneath the transistor 29 to a potential Vdds.

Figure 6:
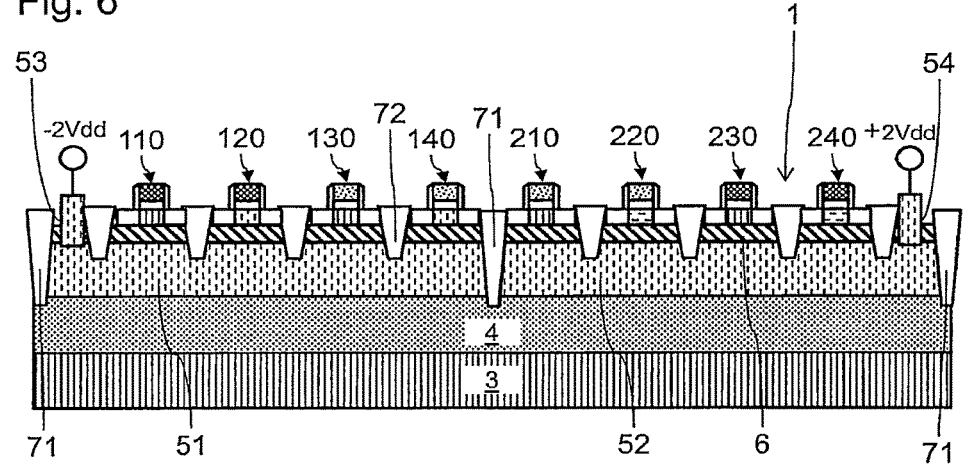
FIG. 6 is a cross-sectional view of an integrated circuit according to an example of a second embodiment of the invention.

FIG. 6 is a cross-sectional view of an integrated circuit 1 according to an example of a second embodiment of the invention. The integrated circuit 1 includes nMOS transistors 11 to 14 having different threshold voltages, respectively SLVT, LVT, RVT and HVT. The integrated circuit 1 includes pMOS transistors 21 to 24 having different threshold voltages, respectively SLVT, LVT, RVT and HVT.

The active semiconductor layer is identical to that of the first embodiment. The transistors 11 to 14 and 21 to 24 have respective gate stacks 110, 120, 130, 140, 210, 220, 230 and 240, arranged on the active layer. Aside from the materials, these gate stacks have the same structure as in the first embodiment. The layer 6 has the same structure as in the first embodiment. The wells 51 and 52 have the same structure as in the first embodiment. The wells 51 and 52 are biased by terminals 53 and 54, respectively, having the same structure as in the first embodiment. The isolation trenches 71 and 72 have the same structure as in the first embodiment. The dielectric layer 4 has the same structure as in the first embodiment.

The gate stacks 110 and 120 of the transistors 11 and 12 have one and the same gate material composition. This gate material composition is the same as that of the gate materials of the gate stacks 230 and 240 of the transistors 23 and 24.

The gate stacks 130 and 140 of the transistors 13 and 14 have one and the same gate material composition. This gate material composition is the same as that of the gate materials of the gate stacks 210 and 220 of the transistors 21 and 22. The gate materials of the gate stacks 110 and 130, by contrast, have different work functions.

Thus, according to this embodiment, only two different gate material compositions are used to achieve four threshold voltage levels both for the nMOS transistors and for the pMOS transistors, as detailed hereinafter.

As in the first embodiment, the channel regions of the nMOS transistors 11, 12, 13 and 14 have two different channel doping configurations, and only two different configurations. One channel region is for example of the not intentionally doped type, the other channel region being, for example, of the P-doped type. This difference in doping type is configured to bring about a threshold voltage difference DVT between two otherwise identical nMOS transistors. The threshold voltage difference DVT corresponds to the threshold voltage difference that it is desired to achieve between the various successive threshold voltage levels of the nMOS transistors.

As in the first embodiment, the channel regions of the pMOS transistors 21, 22, 23 and 24 have two different channel doping configurations, and only two different configurations. One channel region is for example of the not intentionally doped type, the other channel region being, for example, of the N-doped type. This difference in doping type is configured to bring about a threshold voltage difference DVT between two otherwise identical pMOS transistors. The threshold voltage difference DVT corresponds to the threshold voltage difference that it is desired to achieve between the various successive threshold voltage levels of the pMOS transistors.

As in the first embodiment, use will be made of nMOS transistors 11 to 14 having a channel region having a tensile stress in the direction of conduction. Use will be made of pMOS transistors 21 to 24 having a channel region having a compressive stress in the direction of conduction.

Moreover, in order to make it possible to balance the respective threshold voltages of an nMOS transistor and of a pMOS transistor of one and the same level, with the parameters mentioned previously, the various transistors will also satisfy the following equation:

$$Gp*Vdds-Gn*Gnds=Sn*|\sigma n|+Sp*(|\sigma p|-1.65*10^9)-VarCais+K$$

In the example of FIG. 6:

only 2 different gate material compositions are used, therefore K=2*DVT; VarCais=DVT The equation therefore then becomes:

$$Gp*Vdds-Gn*Gnds=Sn*|\sigma n|+Sp*(|\sigma p|-1.65*10^9)-VarCais+2*DVT$$

We will continue in this case with a scenario where the value DVT between the successive threshold voltage levels is 80 mV.

For two nMOS transistors of successive threshold voltages (for example the SLVT transistor 11 and the LVT transistor 12), their respective threshold voltages will be denoted by Vtn1 and Vtn2, with Vtn1<Vtn2.

For two pMOS transistors of successive threshold voltages (for example the SLVT transistor 21 and the LVT transistor 22), their respective threshold voltages will be denoted by Vtp1 and Vtp2, with −Vtp1<−Vtp2 (and |Vtp1|<|Vtp2|, the threshold voltages of the pMOS transistors being negative).

\Depending on various parameters, the threshold voltage of the transistors varies linearly with the stress and the effective work function of the gate:

Vtn≈Wfn−Gn*Gnds−Sn*|σn| for the threshold voltage Vtn of an nMOS transistor;

−Vtp≈−Wfp+Gp*Vdds−Sp*|σp| for the threshold voltage Vtp of a pMOS transistor;

For two otherwise identical transistors, it is desired that passing from one threshold voltage level to another (shifting of a DVT amplitude) be achieved in a manner dependent on the doping or lack of doping of the channel.

For two otherwise identical transistors, it is desired that the influence of the work function of the gate material on the value DVT correspond to a difference of two output voltage levels (for example from SLVT to RVT). This requirement may be expressed as follows:

2DVT=(DWfn2−DWfn1) for an nMOS

2DVT=(DWfp1−DWfp2) for a pMOS

To limit the number of different gate materials to 2, in this case we choose Wfp1=Wfn1, and DWfn2>DWfn1, and DWfp1>DWfp2

In the example of FIG. 6, it is desired:

that the first nMOS transistor have the same threshold voltage as an nMOS transistor with an unstressed and undoped channel, with an N-doped and unbiased back gate, and with TiN as gate material;

that the first pMOS transistor have the same threshold voltage as a pMOS transistor with an SiGe channel subjected to 1.65 GPa of compressive stress, with a P-doped and unbiased back gate, and with TiN as gate material. nMOS and pMOS transistors corresponding to the 14 nm/22 nm technological node are taken as reference in this case.

As in the first embodiment, the bias of the wells 51 and 52 may be simplified by choosing Vdds=−Gnds=Vdd, or Vdds=−Gnds=2 Vdd.

The following table outlines the configurations of the various transistors of FIG. 6:

| Transistor | Gate | Channel | Channel doping | Well bias |
|---|---|---|---|---|
| 11 SLVT | TiN La | Si subjected to tensile stress | No | −2Vdd |
| 12 LVT | TiN La | Si subjected to tensile stress | P-type | −2Vdd |
| 13 RVT | TiN Al | Si subjected to tensile stress | No | −2Vdd |
| 14 HVT | TiN Al | Si subjected to tensile stress | P-type | −2Vdd |
| 21 SLVT | TiN Al | $Si_{0.65}Ge_{0.35}$ | No | +2Vdd |
| 22 LVT | TiN Al | $Si_{0.65}Ge_{0.35}$ | N-type | +2Vdd |
| 23 RVT | TiN La | $Si_{0.65}Ge_{0.35}$ | No | +2Vdd |
| 24 HVT | TiN La | $Si_{0.65}Ge_{0.35}$ | N-type | +2Vdd |

The concentration of dopant in the doped channels in this case is $10^{18}$ $cm^{-3}$.

In this example, the work function of the gate materials is modulated:

by including lanthanum in a gate metal made of TiN of the gate stack, to lower its work function;

by including aluminium in a gate metal made of TiN of the gate stack, to increase its work function.

In this example, a bias of −2 Vdd on the well 51 brings about a reduction in the threshold voltage of the nMOS transistors of 160 mV, and a bias of +2 Vdd on the well 52 brings about an increase in the threshold voltage of the pMOS transistors of 160 mV.

For the transistor 11 of the table, starting from the threshold voltage Vrefn corresponding to the reference nMOS transistor, its voltage Vtn is defined as follows:

Vtn11=Vrefn−120 mV [gate material made of TiN La of a given thickness]+80 mV [P-doped well]−140 mV [tensile stress of the channel region]+160 mV [bias of the well to −Vdd]=Vrefn−20 mV For the transistor 12, Vtn12=Vtn11+80 mV [P-doping of the channel]=Vrefn+60 mV For the transistor 13, Vtn13=Vtn11+160 mV [work function for a gate material made of Tin Al]=Vrefn+140 mV For the transistor 14, Vtn14=Vtn12+160 mV [work function for a gate material made of Tin Al]=Vrefn+220 mV For the transistor 21 of the table, starting from the threshold voltage Vrefp corresponding to the reference pMOS transistor, its voltage Vtp is defined as follows:

|Vtp21|=Vrefp −40 mV [gate material made of TiN Al]−140 mV [compressive stress of the channel region with 35% Ge]+160 mV [bias of the well to +Vdd]=|Vrefp|−20 mV For the transistor 22, |Vtp22|=|Vtp21|+80 mV [N-doping of the channel]=|Vrefp|+60 mV For the transistor 23, |Vtp23|=|Vtp21|+160 mV [work function for a gate material made of Tin La]=|Vrefp|+140 mV For the transistor 24, |Vtp24|=|Vtp22|−160 mV [work function for a gate material made of Tin La]=|Vrefp|+220 mV For the examples of this table, certain parameters have been adjusted, such as the thicknesses of lanthanum in the gate materials, or else the influence of the bias voltage on the threshold voltage.

According to one numerical application, Vdds=−Gnds=1.75 V. It is thus possible to deduce therefrom DWfn1=−115 mV and DWfp1=45 mV.

Figure 4:
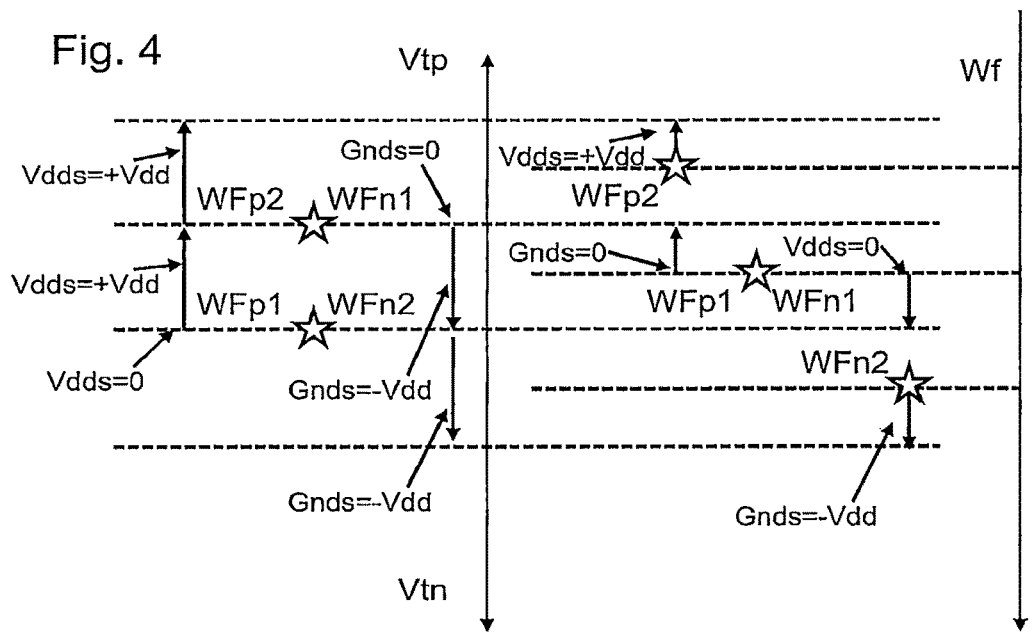
FIG. 4 is a diagram

FIG. 4 is a schematic diagram illustrating the progression of the threshold voltage of the transistors depending on the various parameters mentioned previously.

The right-hand part corresponds to the first embodiment. The left-hand part corresponds to the second embodiment.

The diagram illustrates the various work functions used, together with the influence of diverse parameters on the threshold voltage of the nMOS and pMOS transistors.

Figure 5:
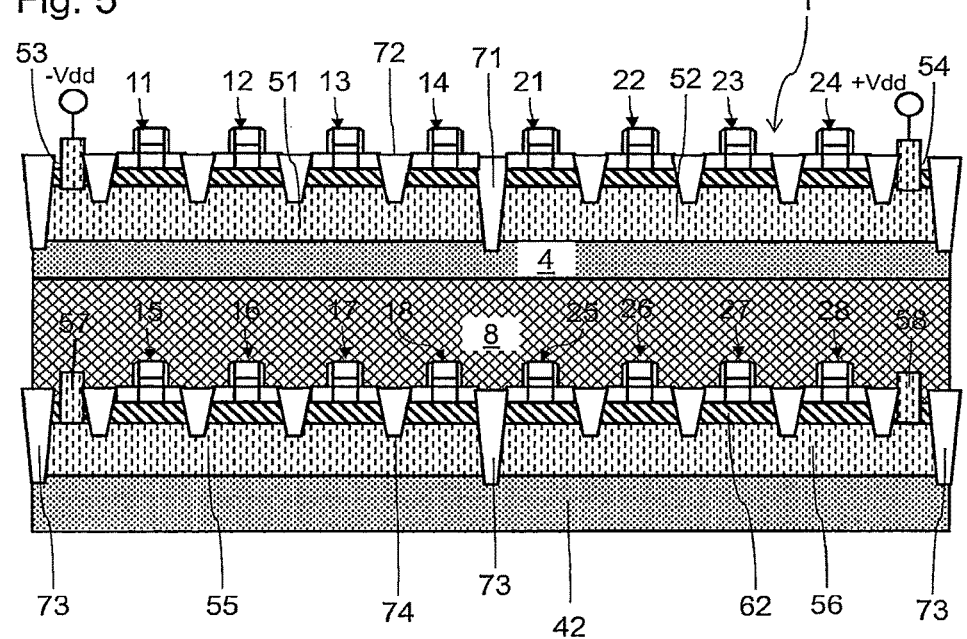
FIG. 5 is a cross-sectional view of an integrated circuit according to a variant of the first embodiment.

FIG. 5 is a cross-sectional view of an integrated circuit 1, according to a variant of the first embodiment. According to this variant, a three-dimensional stack of a plurality of layers of transistors is produced for the purpose of reducing the area of the substrate occupied by the integrated circuit 1.

The upper part of the integrated circuit 1 corresponds to the integrated circuit illustrated with reference to FIG. 1, as far as the dielectric layer 4. The upper part constitutes the upper layer of transistors, including four nMOS transistors 11 to 14 having four different threshold voltage levels, and including four pMOS transistors 21 to 24 having four different threshold voltage levels. As a replacement for the substrate 3, a dielectric passivation layer 8 is arranged underneath the upper layer of transistors. The passivation layer 8 encapsulates a lower layer of transistors. The lower layer of transistors includes four nMOS transistors 15 to 18 having four different threshold voltage levels, and includes four pMOS transistors 25 to 28 having four different threshold voltage levels. The transistors 15 to 18 are identical to the transistors 11 to 14, respectively. The transistors 25 to 28 are identical to the transistors 21 to 24, respectively. The transistors 15 to 18 and 25 to 28 are arranged on an insulating layer 62.

A well 55 is arranged underneath the nMOS transistors 15 to 18, underneath the insulation layer 62. A well 56 is arranged underneath the pMOS transistors 25 to 28, underneath the insulation layer 62. The wells 55 and 56 in this case have one and the same P-type doping and have one and the same concentration of P-type dopants, identical to the wells 51 and 52. A terminal 57 makes it possible to bias the well 55 to the potential Gnds. A terminal 58 makes it possible to bias the well 56 to the potential Vdds. The well 55 extends as far as into contact with the insulation layer 62, and the upper part of the well 55 thus forms a biased back gate for each of the transistors 15 to 18. The well 56 extends as far as into contact with the insulation layer 62, and the upper part of the well 56 thus forms a biased back gate for each of the transistors 25 to 28.

The transistors 15 to 18 are isolated from one another by isolation trenches 74 passing through their active layer. The isolation trenches 74 do not extend through the well 55, so that the entire well 55 is able to be biased by means of the terminal 57. The transistors 25 to 28 are also isolated from one another by isolation trenches 74 passing through their active layer. The isolation trenches 74 do not extend through the well 56, so that the entire well 56 is able to be biased by means of the terminal 58. As an alternative, MESA isolation trenches 74 may also be produced.

The wells 55 and 56 are formed on a dielectric layer 42. The dielectric layer 42 may also, in a manner known per se, be replaced with a deeply buried well, the doping of which is opposite to that of the wells 55 and 56. The dielectric layer 42 may be formed on a substrate of semiconductor material, not illustrated. Deep isolation trenches 73 extend through the active layers and, where appropriate, through the wells 55 and 56, as far as the dielectric layer 42. The isolation trenches 73 make it possible to isolate the nMOS transistors 15 to 18 from the other transistors, and make it possible to isolate the pMOS transistors 25 to 28 from the other transistors. The isolation trenches 73 make it possible in particular, where appropriate, to isolate the well 55 and the well 56 with respect to a potential other than that of their respective terminal. The isolation trenches 73 make it possible in particular to bias the wells 55 and 56 independently with respect to one another.

The invention claimed is:

1. An integrated circuit comprising:
first to third nMOS transistors having different threshold voltages, and first to third pMOS transistors having different threshold voltages, said transistors being arranged on an insulating layer having a thickness at most equal to 50 nm, and said transistors having respective gate stacks, where one or both of said nMOS transistors have channel regions made of silicon subjected to tensile stress in their direction of conduction and said pMOS transistors have channel regions made of SiGe subjected to compressive stress in their direction of conduction; and
a first well arranged underneath the insulating layer underneath said nMOS transistors, a second well arranged underneath the insulating layer underneath said pMOS transistors, wherein
the first and the second wells have one and the same type of doping with one and the same concentration of dopant, said first well being biased to a first bias Gnds, and said second well being biased to a second bias Vdds different from the first bias Gnds,
at least a first pair of said gate stacks of said nMOS transistors comprise one and the same gate material, and at least a second pair of said gate stacks of said nMOS transistors comprise gate materials having separate work functions, the work function difference between the gate materials of said at least the second pair of said gate stacks bringing about a threshold voltage difference of a value of 2*DVT between said nMOS transistors associated with the second pair of said gate stacks,
at least a first pair of said gate stacks of said pMOS transistors comprise one and the same gate material, and at least a second pair of said gate stacks of said pMOS transistors comprise gate materials having separate work functions, the work function difference between the gate materials of said at least the second pair of said gate stacks bringing about a threshold voltage difference of the value of 2*DVT between said pMOS transistors associated with the second pair of said gate stacks,
at least one gate stack of one of said nMOS transistors has one and the same gate material as a gate stack of one of said pMOS transistors,
said nMOS transistors have only two different channel doping configurations, and said pMOS transistors have only two different channel doping configurations, where a difference in channel doping configuration between a pair of nMOS transistors brings about a threshold voltage difference DVT, and a difference in channel doping configuration between a pair of pMOS transistors brings about the threshold voltage difference DVT, and
the following equation is satisfied:

$$Gp*Vdds - Gn*Gnds = Sn*|\sigma n| + Sp*(|\sigma p| - 1.65*10^9) - VarCais + K,$$

where Gn is the sensitivity of the threshold voltage of the nMOS transistors to the doping of the first well, Sn is the sensitivity of the threshold voltage of the nMOS transistors to the tensile stress in their channel region, $\sigma n$ is the amplitude of the tensile stress in the channel region of the nMOS transistors, Gp is the sensitivity of the threshold voltage of the pMOS transistors to the doping of the second well, Sp is the sensitivity of the threshold voltage of the pMOS transistors to the compressive stress in their channel region, $\sigma p$ is the amplitude of the tensile stress in the channel region of the pMOS transistors, VarCais is a threshold voltage shift dependent on the doping of the first and second wells, and
where K=2*DVT if the various gate stacks of said nMOS and pMOS transistors comprise only two different gate material compositions, and K=0 if the various gate stacks of said nMOS and pMOS transistors comprise at least three different gate material compositions.

2. The integrated circuit according to claim 1, wherein the various gate stacks of said nMOS and pMOS transistors include three and only three different gate material compositions.

3. The integrated circuit according to claim 1, wherein the various gate stacks of said nMOS and pMOS transistors include two and only two different gate material compositions.

4. The integrated circuit according to claim 1, wherein Vdds=−Gnds.

5. The integrated circuit according to claim 4, wherein the second bias Vdds is equal to a supply voltage of said transistors.

6. The integrated circuit according to claim 1, wherein said first and second wells have a P-type doping.

7. The integrated circuit according to claim 1, wherein said nMOS transistors have channel regions that are either not intentionally doped or doped with a P-type doping, and wherein said pMOS transistors have channel regions that are either not intentionally doped or doped with an N-type doping.

8. The integrated circuit according to claim 1, wherein said insulating layer has a thickness of between 5 and 25 nm.

9. The integrated circuit according to claim 1, wherein said gate materials all include a TiN alloy.

10. The integrated circuit according to claim 9, wherein one of said gate materials is TiNAl.

11. The integrated circuit according to claim 1, wherein said first and second wells are arranged on a dielectric layer, said integrated circuit furthermore comprising a deep isolation trench extending between said first and second wells as far as into contact with the dielectric layer.

12. The integrated circuit according to claim 1, further comprising another layer of nMOS and pMOS transistors arranged underneath said first to third nMOS transistors and said first to third pMOS transistors, said another layer being separated from said first to third nMOS and said first to third pMOS transistors by an isolating passivation layer, so as to form a three-dimensional stack of a plurality of layers of transistors.

13. The integrated circuit according to claim 1, further comprising:
a fourth nMOS transistor having a threshold voltage different from that of the first to third nMOS transistors; and
a fourth pMOS transistor having a threshold voltage different from that of the first to third pMOS transistors,
said fourth nMOS and pMOS transistors being arranged on said insulating layer and having respective gate stacks, one or both of said first to fourth nMOS transistors having channel regions made of silicon subjected to tensile stress in their direction of conduction and said first to fourth pMOS transistors having channel regions made of SiGe subjected to compressive stress in their direction of conduction, said first to fourth nMOS transistors having only two different channel doping configurations, and said first to fourth pMOS transistors having only two different channel doping configurations, said equation $Gp*Vdds-Gn*Gnds=Sn*|\sigma n|+Sp*(|\sigma p|-1.65*10^9)-VarCais+K$ being satisfied for the first to fourth nMOS transistors and for the first to fourth pMOS transistors, where $K=2*DVT$ if the various gate stacks of said first to fourth nMOS and pMOS transistors comprise only two different gate material compositions, and $K=0$ if the various gate stacks of said first to fourth nMOS and pMOS transistors comprise at least three different gate material compositions.

* * * * *